United States Patent
Wei et al.

(10) Patent No.: US 10,008,160 B2
(45) Date of Patent: Jun. 26, 2018

(54) LIQUID CRYSTAL DISPLAY APPARATUS

(71) Applicant: SHENZHEN CHINA STAR OPTOELECTRONICS TECHNOLOGY CO., LTD., Shenzhen, Guangdong (CN)

(72) Inventors: Hongquan Wei, Guangdong (CN); Tao Hu, Guangdong (CN); Xiaolong Ma, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 54 days.

(21) Appl. No.: 15/113,638

(22) PCT Filed: Apr. 8, 2016

(86) PCT No.: PCT/CN2016/078760
§ 371 (c)(1),
(2) Date: Jul. 22, 2016

(87) PCT Pub. No.: WO2017/152452
PCT Pub. Date: Sep. 14, 2017

(65) Prior Publication Data
US 2017/0372667 A1    Dec. 28, 2017

(30) Foreign Application Priority Data
Mar. 11, 2016  (CN) .......................... 2016 1 0139328

(51) Int. Cl.
*G09G 3/34*      (2006.01)
*G02F 1/1335*    (2006.01)
(Continued)

(52) U.S. Cl.
CPC ....... *G09G 3/3413* (2013.01); *G02F 1/13362* (2013.01); *G02F 1/133621* (2013.01);
(Continued)

(58) Field of Classification Search
CPC ........... G02F 1/13362; G02F 1/133621; G02F 1/136286; G02F 1/1368; G02F 2201/121;
(Continued)

(56) References Cited

U.S. PATENT DOCUMENTS 6,789,921 B1 * 9/2004 Deloy ............... G02F 1/133603
                                              362/238
7,794,098 B2 * 9/2010 Chang ............... G02F 1/133603
                                              362/231
(Continued)

FOREIGN PATENT DOCUMENTS

CN      101782702 A    7/2010
CN      101794040 A    8/2010
(Continued)

*Primary Examiner* — Tony Davis
(74) *Attorney, Agent, or Firm* — Muncy, Geissler, Olds & Lowe, P.C.

(57) ABSTRACT

A liquid crystal display apparatus is provided. The liquid crystal display apparatus includes a graphene LED backlight source, a first polarizing film, a first substrate, a liquid crystal layer, a second substrate and a second polarizing film. The graphene LED backlight source is used for providing light output, the first polarizing film is used for converting the light output from the backlight source into a polarized light. The liquid crystal layer includes liquid crystal molecules used for deflecting the polarized light from the backlight source to form a polarized output light, and the second polarizing film is used for emitting the polarized output light.

14 Claims, 1 Drawing Sheet

(51) Int. Cl.
*G02F 1/1362* (2006.01)
*H01L 33/34* (2010.01)
*H01L 25/13* (2006.01)
*H01L 33/40* (2010.01)
G09G 3/36 (2006.01)
G02F 1/1368 (2006.01)

(52) U.S. Cl.
CPC ........ *G02F 1/136286* (2013.01); *H01L 25/13* (2013.01); *H01L 33/34* (2013.01); *H01L 33/40* (2013.01); *G02F 1/1368* (2013.01); *G02F 2201/121* (2013.01); *G02F 2201/123* (2013.01); *G02F 2203/34* (2013.01); *G09G 3/3607* (2013.01)

(58) Field of Classification Search
CPC .......... G02F 2201/123; G02F 2203/34; G09G 3/3413; G09G 3/3607; H01L 25/13; H01L 33/34; H01L 33/40

USPC .................................. 345/170–176; 362/612
See application file for complete search history.

(56) References Cited

U.S. PATENT DOCUMENTS

| | | | |
|---|---|---|---|
| 9,293,719 | B2 | 3/2016 | Ishii et al. |
| 9,634,271 | B2 | 4/2017 | Ishii et al. |
| 2006/0092666 | A1* | 5/2006 | Jeong ................. G02F 1/133603 362/613 |
| 2014/0377893 | A1 | 12/2014 | Ishitani et al. |
| 2015/0370099 | A1* | 12/2015 | Yan ........................ G02F 1/137 349/57 |

FOREIGN PATENT DOCUMENTS

| | | |
|---|---|---|
| CN | 103633244 A | 3/2014 |
| CN | 104124348 A | 10/2014 |

* cited by examiner

LIQUID CRYSTAL DISPLAY APPARATUS

FIELD OF THE INVENTION

The present invention relates to the technical field of a display, and particularly to a liquid crystal display apparatus.

BACKGROUND OF THE INVENTION

A conventional liquid crystal display apparatus includes a liquid crystal display panel and a backlight source. The liquid crystal display panel includes an array substrate, a color filter substrate, and a liquid crystal layer disposed between the array substrate and the color filter substrate. The array substrate includes data lines, scan lines, and pixel units formed by the data lines and the scan lines. The color filter substrate includes a common electrode, color filters, etc. The backlight source is used for providing white light output.

In order to realize multi-color display on the liquid crystal display panel, red sub-pixel units, green sub-pixel units, and blue sub-pixel units forming the pixel units are disposed on the array substrate. The red sub-pixel unit cooperates with the red color filter on the color filter substrate to emit red light, the green sub-pixel unit cooperates with the green color filter on the color filter substrate to emit green light, and the blue sub-pixel unit cooperates with the blue color filter on the color filter substrate to emit blue light. Thus the red sub-pixel unit, the green sub-pixel unit, and the blue sub-pixel unit form a color pixel unit.

Therefore, in order to realize color display, it is required to dispose a plurality of single-color sub-pixel units in the conventional liquid crystal display panel, and, moreover, it is also required to dispose a black matrix among the sub-pixel units for preventing interference among different single-color sub-pixel units, causing a conventional liquid crystal display apparatus with high manufacture cost and low image resolution.

Therefore, it is necessary to provide a liquid crystal apparatus to solve the problem in the conventional technique.

SUMMARY OF THE INVENTION

For this reason, the present invention provides a liquid crystal display apparatus which does not require disposing color filters and a black matrix therein and has high image resolution and low manufacture cost, for resolving the technical problem of the conventional liquid crystal display apparatus with high manufacture cost and low image resolution.

To achieve the above object, the present invention provides a liquid crystal display (LCD) apparatus, comprising:
 a graphene LED backlight source for providing a light output having one of red, green, and blue colors;
 a first polarizing film for converting the light output from the backlight source into a polarized light;
 a first substrate including data lines, scan lines, and pixel units formed by data lines and the scan lines, wherein the pixel units include pixel electrodes;
 a liquid crystal layer including liquid crystal molecules used for deflecting the polarized light from the backlight source to form a polarized output light;
 a second substrate including common electrodes used for cooperating with the pixel electrodes to drive the liquid crystal molecules; and
 a second polarizing film for emitting the polarized output light;
 wherein the graphene LED backlight source includes a plurality of graphene LED chips,
 wherein the graphene LED chips each include:
 an anode terminal for connecting a positive electrode of a power supply;
 a cathode terminal for connecting a negative electrode of the power supply;
 a control terminal for inputting a control voltage, wherein the control voltage is used for controlling a wavelength of the light output from the backlight source; and
 a light-emitting layer for emitting the light output from the backlight source based upon the control voltage and a voltage of the power supply;
 wherein the liquid crystal layer is a blue phase liquid crystal layer including blue phase liquid crystal molecules.

In the liquid crystal display apparatus of the present invention, an image frame of the liquid crystal display apparatus includes a red image frame, a blue image frame, and a green image frame;
 when the liquid crystal display apparatus is in the red image frame, the graphene LED backlight source provides the red light output, and the data lines provide data signals of the red image frame;
 when the liquid crystal display apparatus is in the blue image frame, the graphene LED backlight source provides the blue light output, and the data lines provide data signals of the blue image frame; and
 when the liquid crystal display apparatus is in the green image frame, the graphene LED backlight source provides the green light output, and the data lines provide data signals of the green image frame.

In the liquid crystal display apparatus of the present invention, a display duration of the red image frame, a display duration of the blue image frame, and a display duration of the green image frame are equal to each other.

In the liquid crystal display apparatus of the present invention, based upon persistence of vision, one of the red image frame, the blue image frame, and the green image frame, to which the image frame corresponds, form a display image in eyes of a user of the liquid crystal display apparatus.

In the liquid crystal display apparatus of the present invention, a material of the anode terminal comprises at least one of polyethylene dioxythiophene, carbon nanotubes, and a mixture of polyethylene dioxythiophene and carbon nanotubes.

In the liquid crystal display apparatus of the present invention, a material of the cathode terminal comprises at least one of polyethylene dioxythiophene, polypyrrole, carbon nanotubes, and a mixture of polyethylene dioxythiophene, polypyrrole, and carbon nanotubes.

In the liquid crystal display apparatus of the present invention, a material of the control terminal is oxidized graphene.

In the liquid crystal display apparatus of the present invention, a material of the light-emitting layer is reduced graphene.

The present invention also provides a liquid crystal display (LCD) apparatus, comprising:
 a liquid crystal display (LCD) apparatus, comprising:
 a graphene LED backlight source for providing a light output having one of red, green, and blue colors;
 a first polarizing film for converting the light output from the backlight source into a polarized light;
 a first substrate including data lines, scan lines, and pixel units formed by data lines and the scan lines, wherein the pixel units include pixel electrodes;

a liquid crystal layer including liquid crystal molecules used for deflecting the polarized light from the backlight source to form a polarized output light;

a second substrate including common electrodes used for cooperating with the pixel electrodes to drive the liquid crystal molecules; and a second polarizing film for emitting the polarized output light.

In the liquid crystal display apparatus of the present invention, an image frame of the liquid crystal display apparatus includes a red image frame, a blue image frame, and a green image frame;

when the liquid crystal display apparatus is in the red image frame, the graphene LED backlight source provides the red light output, and the data lines provide data signals of the red image frame;

when the liquid crystal display apparatus is in the blue image frame, the graphene LED backlight source provides the blue light output, and the data lines provide data signals of the blue image frame; and when the liquid crystal display apparatus is in the green image frame, the graphene LED backlight source provides the green light output, and the data lines provide data signals of the green image frame.

In the liquid crystal display apparatus of the present invention, a display duration of the red image frame, a display duration of the blue image frame, and a display duration of the green image frame are equal to each other.

In the liquid crystal display apparatus of the present invention, based upon persistence of vision, one of the red image frame, the blue image frame, and the green image frame, to which the image frame corresponds, form a display image in eyes of a user of the liquid crystal display apparatus.

In the liquid crystal display apparatus of the present invention, the graphene LED backlight source includes a plurality of graphene LED chips, wherein the graphene LED chips each include:

an anode terminal for connecting a positive electrode of a power supply;

a cathode terminal for connecting a negative electrode of the power supply;

a control terminal for inputting a control voltage, wherein the control voltage is used for controlling a wavelength of the light output from the backlight source; and a light-emitting layer for emitting the light output from the backlight source based upon the control voltage and a voltage of the power supply.

In the liquid crystal display apparatus of the present invention, a material of the anode terminal comprises at least one of polyethylene dioxythiophene, carbon nanotubes, and a mixture of polyethylene dioxythiophene and carbon nanotubes.

In the liquid crystal display apparatus of the present invention, a material of the cathode terminal comprises at least one of polyethylene dioxythiophene, polypyrrole, carbon nanotubes, and a mixture of polyethylene dioxythiophene, polypyrrole, and carbon nanotubes.

In the liquid crystal display apparatus of the present invention, a material of the control terminal is oxidized graphene.

In the liquid crystal display apparatus of the present invention, a material of the light-emitting layer is reduced graphene.

In the liquid crystal display apparatus of the present invention, the liquid crystal layer is a blue phase liquid crystal layer including blue phase liquid crystal molecules.

By disposing the graphene LED backlight source in the liquid crystal display apparatus of the present invention, the backlight source can directly emit the red, green, and blue light, and therefore it does not require disposing any color filters and a black matrix on the second substrate. Hence, the liquid crystal display apparatus has high image resolution and low manufacture cost. The technical problem of the conventional liquid crystal display apparatus with high manufacture cost and low image resolution is resolved.

BRIEF DESCRIPTION OF THE DRAWINGS

In order to more clearly illustrate the embodiments of the present invention or the technical solutions in prior arts, the following briefly introduces the accompanying drawings used in the embodiments. Obviously, the drawings in the following description merely show some of the embodiments of the present invention. As regards one of ordinary skill in the art, other drawings can be obtained in accordance with these accompanying drawings without making creative efforts.

DETAILED DESCRIPTION OF THE PREFERRED EMBODIMENTS

Please refer to the figures in the accompanying drawings. The components with the same reference numbers represent the same or similar components. The following description is based on the illustrated specific embodiments of the present invention, and should not be construed to limit the other specific embodiments which are not described in detail herein.

Figure 1:
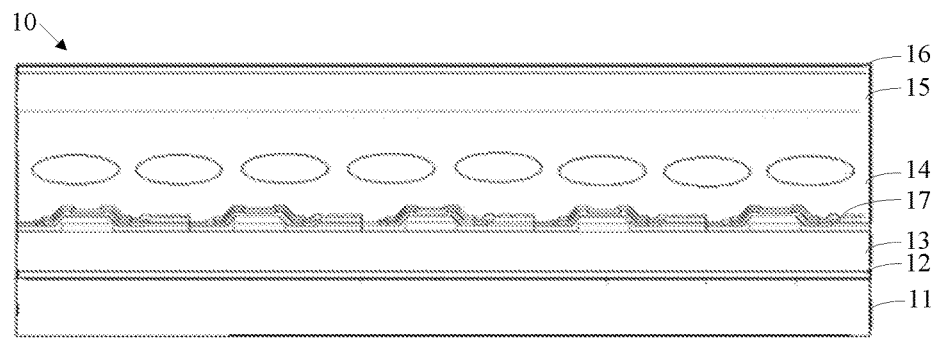
FIG. 1 is a structural schematic diagram of a liquid crystal apparatus in accordance with a preferred embodiment of the present invention.

Please refer to FIG. 1, which is a structural schematic diagram of a liquid crystal apparatus in accordance with a preferred embodiment of the present invention. In the preferred embodiment, the liquid crystal display apparatus 10 includes a graphene LED backlight source 11, a first polarizing film 12, a first substrate 13, a liquid crystal layer 14, a second substrate 15, and a second polarizing film 16.

The graphene LED backlight source 11 is used for providing a light output having one of red, green, and blue colors. The first polarizing film 12 is used for converting the light output from the backlight source into a polarized light. The first substrate 13 includes data lines, scan lines, and pixel units 17 formed by data lines and the scan lines, wherein the pixel units include pixel electrodes. The liquid crystal layer 14 includes liquid crystal molecules used for deflecting the polarized light from the backlight source to form a polarized output light. The second substrate 15 includes a common electrode used for cooperating with the pixel electrodes to drive the liquid crystal molecules. The second polarizing film 16 is for emitting the polarized output light. Preferably, the liquid crystal layer 14 is a blue phase liquid crystal layer including blue phase liquid crystal molecules. The response duration of the blue phase liquid crystal molecules is in the order of magnitude of sub-milliseconds, and so can effectively match the graphene LED backlight source 11 which has a high switching frequency.

Figure 2:
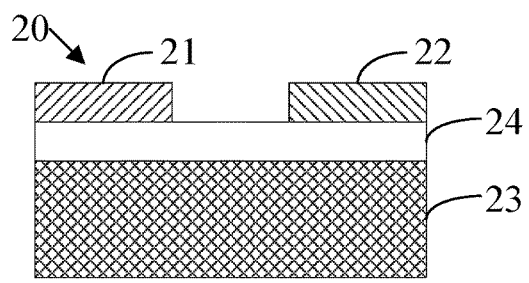
FIG. 2 is a structural schematic diagram of a graphene LED chip of a graphene LED backlight source of a liquid crystal apparatus in accordance with a preferred embodiment of the present invention.
Figure 3:
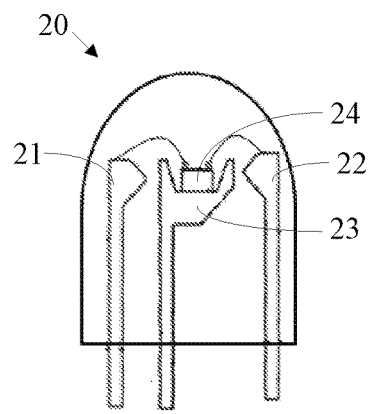
FIG. 3 is a specific structural schematic diagram of a graphene LED chip of a graphene LED backlight source of a liquid crystal apparatus in accordance with a preferred embodiment of the present invention.

The graphene LED backlight source 11 includes a plurality of graphene LED chips 20, wherein one of which is shown in FIG. 2 and FIG. 3. FIG. 2 is a structural schematic diagram of a graphene LED chip of a graphene LED backlight source of a liquid crystal apparatus in accordance with a preferred embodiment of the present invention, and FIG. 3 is a specific structural schematic diagram of a graphene LED chip of a graphene LED backlight source of a liquid crystal apparatus in accordance with a preferred embodiment of the present invention.

The graphene LED chip 20 includes an anode terminal 21, a cathode terminal 22, a control terminal 23, and a light-emitting layer 24. The anode terminal 21 is used for connecting a positive electrode of a power supply (not shown in the figures). The cathode terminal 22 is used for connecting a negative electrode of the power supply (not shown in the figures). The control terminal 23 is used for inputting a control voltage, wherein the control voltage is used for controlling the wavelength of the light output from the backlight source. The light-emitting layer 24 is used for emitting the light output from the backlight source based upon the control voltage and the voltage of the power supply. The light-emitting layer 24 is located among the anode terminal 21, the cathode terminal 22, and control terminal 23.

The anode terminal 21 and the cathode terminal 22 should be made of an effectively conductive material. The material of the anode terminal 21 includes, but is not limited to, at least one of polyethylene dioxythiophene (PEDOT), carbon nanotubes (CNT), and a mixture of polyethylene dioxythiophene and carbon nanotubes. The material of the cathode terminal 22 includes, but is not limited to, at least one of polyethylene dioxythiophene, polypyrrole, carbon nanotubes, and a mixture of polyethylene dioxythiophene and carbon nanotubes. The material of the control terminal 23 is oxidized graphene, and the material of the light-emitting layer 24 is reduced graphene.

PEDOT has the conjugated structure of $\pi$-$\pi$* bonds, facilitating the injection of electrons into the light-emitting layer of the reduced graphene. Carbon nanotubes are nanoscale hollow tubes formed by curling graphite-like planes constituted by rings of six carbon atoms. Carbon nanotubes have decent electrical conductivity, high thermal stability, and intrinsic mobility; therefore, carbon nanotubes are an ideal material for forming electrodes.

In the present preferred embodiment, an image frame of the liquid crystal display apparatus 10 includes a red image frame, a blue image frame, and a green image frame. In use, the liquid crystal display apparatus of the present embodiment performs a time-sharing control on the graphene LED backlight source 11, that is, the display duration of a image frame is divided into the display durations of three sub-image frames, and in the display durations of three sub-image frames, the liquid crystal display apparatus 10 respectively displays a red image frame, a blue image frame, and a green image frame.

When the liquid crystal display apparatus 10 is in the red image frame, the graphene LED backlight source provides the red light output (at this time, the voltage of the control signals is 0V, and the wavelength of the light output from the backlight source is 680 nm), and the data lines provide data signals of the red image frame. When the liquid crystal display apparatus 10 is in the green image frame, the graphene LED backlight source provides the green light output (at this time, the voltage of the control signals is 30V, and the wavelength of the light output from the backlight source is 550 nm), and the data lines provide data signals of the green image frame. When the liquid crystal display apparatus is in the blue image frame, the graphene LED backlight source provides the blue light output (at this time, the voltage of the control signals is 50V, and the wavelength of the light output from the backlight source is 470 nm), and the data lines provide data signals of the blue image frame. Herein, the display duration of the red image frame, the display duration of the blue image frame and the display duration of the green image frame are equal to each other for ensuring the stability of the display image.

When the liquid crystal display apparatus 10 of the preferred embodiment displays an image frame, for the first one-third frame duration, the red image frame of the image frame is transmitted to the pixel units 17, and the graphene LED backlight source 11 provides the red light output; for the second one-third frame duration, the green image frame of the image frame is transmitted to the pixel units 17, and the graphene LED backlight source 11 provides the green light output; for the third one-third frame duration, the blue image frame of the image frame is transmitted to the pixel units 17, and the graphene LED backlight source 11 provides the blue light output. In an image frame, based upon persistence of vision, the red image frame, the blue image frame, and the green image frame, to which the image frame corresponds, form a display image in the eyes of a user, that is, the light of the three different colors can create a color-mixing effect, thereby forming a color display image.

This completes the image display process of the liquid crystal display apparatus 10 of the present preferred embodiment.

By disposing the graphene LED backlight source in the liquid crystal display apparatus of the present invention, the backlight source can directly emit the red, green, and blue light, and therefore it does not require disposing any color filters and a black matrix on the second substrate. Hence, the liquid crystal display apparatus has high image resolution and low manufacture cost. The technical problem of the conventional liquid crystal display apparatus with high manufacture cost and low image resolution is resolved.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:
1. A liquid crystal display (LCD) apparatus, comprising:
a graphene LED backlight source for providing a light output having one of red, green, and blue colors;
a first polarizing film for converting the light output from the backlight source into a polarized light;
a first substrate including data lines, scan lines, and pixel units formed by data lines and the scan lines, wherein the pixel units include pixel electrodes;
a liquid crystal layer including liquid crystal molecules used for deflecting the polarized light from the backlight source to form a polarized output light;
a second substrate including common electrodes used for cooperating with the pixel electrodes to drive the liquid crystal molecules; and
a second polarizing film for emitting the polarized output light;

wherein the graphene LED backlight source includes a plurality of graphene LED chips, wherein the graphene LED chips each include:

an anode terminal for connecting a positive electrode of a power supply;

a cathode terminal for connecting a negative electrode of the power supply;

a control terminal for inputting a control voltage, wherein the control voltage is used for controlling a wavelength of the light output from the backlight source; and a light-emitting layer for emitting the light output from the backlight source based upon the control voltage and a voltage of the power supply;

wherein the liquid crystal layer is a blue phase liquid crystal layer including blue phase liquid crystal molecules;

wherein an image frame of the liquid crystal display apparatus includes a red image frame, a blue image frame, and a green image frame;

when the liquid crystal display apparatus is in the red image frame, the graphene LED backlight source provides the red light output, and the data lines provide data signals of the red image frame;

when the liquid crystal display apparatus is in the blue image frame, the graphene LED backlight source provides the blue light output, and the data lines provide data signals of the blue image frame;

when the liquid crystal display apparatus is in the green image frame, the graphene LED backlight source provides the green light output, and the data lines provide data signals of the green image frame; and wherein based upon persistence of vision, one of the red image frame, the blue image frame and the green image frame, to which the image frame corresponds, form a display image in eyes of a user of the liquid crystal display apparatus.

2. The liquid crystal display apparatus as claimed in claim 1, wherein a display duration of the red image frame, a display duration of the blue image frame and a display duration of the green image frame are equal to each other.

3. The liquid crystal display apparatus as claimed in claim 1, wherein a material of the anode terminal comprises at least one of polyethylene dioxythiophene, carbon nanotubes, and a mixture of polyethylene dioxythiophene and carbon nanotubes.

4. The liquid crystal display apparatus as claimed in claim 1, wherein a material of the cathode terminal comprises at least one of polyethylene dioxythiophene, polypyrrole, carbon nanotubes, and a mixture of polyethylene dioxythiophene, polypyrrole, and carbon nanotubes.

5. The liquid crystal display apparatus as claimed in claim 1, wherein a material of the control terminal is oxidized graphene.

6. The liquid crystal display apparatus as claimed in claim 1, wherein a material of the light-emitting layer is reduced graphene.

7. A liquid crystal display (LCD) apparatus, comprising:

a graphene LED backlight source for providing a light output having one of red, green, and blue colors;

a first polarizing film for converting the light output from the backlight source into a polarized light;

a first substrate including data lines, scan lines, and pixel units formed by data lines and the scan lines, wherein the pixel units include pixel electrodes;

a liquid crystal layer including liquid crystal molecules used for deflecting the polarized light from the backlight source to form a polarized output light;

a second substrate including common electrodes used for cooperating with the pixel electrodes to drive the liquid crystal molecules; and a second polarizing film for emitting the polarized output light;

wherein an image frame of the liquid crystal display apparatus includes a red image frame, a blue image frame, and a green image frame;

when the liquid crystal display apparatus is in the red image frame, the graphene LED backlight source provides the red light output, and the data lines provide data signals of the red image frame;

when the liquid crystal display apparatus is in the blue image frame, the graphene LED backlight source provides the blue light output, and the data lines provide data signals of the blue image frame;

when the liquid crystal display apparatus is in the green image frame, the graphene LED backlight source provides the green light output, and the data lines provide data signals of the green image frame; and wherein based upon persistence of vision, one of the red image frame, the blue image frame, and the green image frame, to which the image frame corresponds, form a display image in eyes of a user of the liquid crystal display apparatus.

8. The liquid crystal display apparatus as claimed in claim 7, wherein a display duration of the red image frame, a display duration of the blue image frame and a display duration of the green image frame are equal to each other.

9. The liquid crystal display apparatus as claimed in claim 7, wherein the graphene LED backlight source includes a plurality of graphene LED chips, wherein the graphene LED chips each include:

an anode terminal for connecting a positive electrode of a power supply;

a cathode terminal for connecting a negative electrode of the power supply;

a control terminal for inputting a control voltage, wherein the control voltage is used for controlling a wavelength of the light output from the backlight source; and a light-emitting layer for emitting the light output from the backlight source based upon the control voltage and a voltage of the power supply.

10. The liquid crystal display apparatus as claimed in claim 9, wherein a material of the anode terminal comprises at least one of polyethylene dioxythiophene, carbon nanotubes, and a mixture of polyethylene dioxythiophene and carbon nanotubes.

11. The liquid crystal display apparatus as claimed in claim 9, wherein a material of the cathode terminal comprises at least one of polyethylene dioxythiophene, polypyrrole, carbon nanotubes, and a mixture of polyethylene dioxythiophene, polypyrrole, and carbon nanotubes.

12. The liquid crystal display apparatus as claimed in claim 9, wherein a material of the control terminal is oxidized graphene.

13. The liquid crystal display apparatus as claimed in claim 9, wherein a material of the light-emitting layer is reduced graphene.

14. The liquid crystal display apparatus as claimed in claim 7, wherein the liquid crystal layer is a blue phase liquid crystal layer including blue phase liquid crystal molecules.

* * * * *